(12) United States Patent
Park et al.

(10) Patent No.: US 12,521,977 B2
(45) Date of Patent: Jan. 13, 2026

(54) METHOD OF MANUFACTURING SEMICONDUCTOR DEVICE USING GAS BLOWING AGENT

(71) Applicant: Samsung Electronics Co., Ltd., Suwon-si (KR)

(72) Inventors: Cheonil Park, Seongnam-si (KR); Myoungchul Eum, Asan-si (KR); Hwail Jin, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 766 days.

(21) Appl. No.: 17/861,490

(22) Filed: Jul. 11, 2022

(65) Prior Publication Data

US 2023/0087718 A1    Mar. 23, 2023

(30) Foreign Application Priority Data

Sep. 3, 2021   (KR) .................. 10-2021-0117324

(51) Int. Cl.
| | |
|---|---|
| *B32B 37/12* | (2006.01) |
| *B32B 3/30* | (2006.01) |
| *B32B 7/12* | (2006.01) |
| *B32B 37/18* | (2006.01) |
| *B32B 38/10* | (2006.01) |

(Continued)

(52) U.S. Cl.
CPC .......... *B32B 37/12* (2013.01); *B32B 3/30* (2013.01); *B32B 7/12* (2013.01); *B32B 37/18* (2013.01); *B32B 38/10* (2013.01); *H01L 21/304* (2013.01); *H01L 21/6836* (2013.01); *H01L 21/76898* (2013.01); *B32B 2037/1253* (2013.01); *B32B 2255/26* (2013.01); *B32B 2305/022* (2013.01);

(Continued)

(58) Field of Classification Search
CPC ...................................... B32B 37/12
See application file for complete search history.

(56) References Cited

U.S. PATENT DOCUMENTS

| | | |
|---|---|---|
| 7,172,950 B2 | 2/2007 | Takezoe et al. |
| 8,545,979 B2 | 10/2013 | Kita et al. |

(Continued)

FOREIGN PATENT DOCUMENTS

| | | | |
|---|---|---|---|
| CN | 111565768 A | | 8/2020 |
| JP | 2013185014 A | * | 9/2013 |
| KR | 10-1276487 B1 | | 6/2013 |

OTHER PUBLICATIONS https://enamine.net/building-blocks/medchem/diazirines, Date of Apr. 10, 2021 was retrieved using Wayback Machine Archive. (Year: 2021).*
T. Shiojima et.al, "Development of Self-releasing adhesive tape as a temporary bonding material for 3D integration", Jun. 1, 2020, 2020 IEEE 70th Electronic Components and Technology Conference (ECTC) (2020, pp. 75-82), DOI: 10.1109/ECTC32862.2020.00025 (Year: 2020).*

(Continued)

*Primary Examiner* — Brent A. Fairbanks
*Assistant Examiner* — Krishna J Palaniswamy
(74) *Attorney, Agent, or Firm* — Muir Patent Law, PLLC

(57) ABSTRACT

A method of manufacturing a semiconductor device may include bonding a carrier substrate onto a device wafer using an adhesive member, wherein the adhesive member includes a base film, a device adhesive film disposed on a lower surface of the base film and contacting the device wafer, and a carrier adhesive film disposed on an upper surface of the base film and contacting the carrier substrate. The device adhesive film includes a gas blowing agent, and the carrier adhesive film may not include a gas blowing agent.

20 Claims, 14 Drawing Sheets

(51) Int. Cl.
- H01L 21/304 (2006.01)
- H01L 21/683 (2006.01)
- H01L 21/768 (2006.01)

(52) U.S. Cl.
CPC .............. *B32B 2305/30* (2013.01); *B32B 2310/0831* (2013.01); *B32B 2457/14* (2013.01)

(56) References Cited

U.S. PATENT DOCUMENTS

| | | | |
|---|---|---|---|
| 8,791,549 B2 * | 7/2014 | Chen | H01L 24/11 |
| | | | 257/621 |
| 9,269,561 B2 | 2/2016 | Dang et al. | |
| 10,580,700 B1 | 3/2020 | Lin et al. | |
| 2016/0163590 A1 | 6/2016 | Jung et al. | |
| 2019/0194506 A1 | 6/2019 | Gelorme et al. | |

OTHER PUBLICATIONS https://enamine.net/building-blocks/medchem/diazirines,DateofIOApr.2021wasretrievedusingWaybackMachineArchive. (Year: 2021).*

Lepage et al., "A broadly applicable cross-linker for aliphatic polymers containing C—H bonds," Science, vol. 366, pp. 875-878, 2019.

Nanda et al., "Nonthrombogenic Hydrogel Coatings with Carbene-Cross-Linking Bioadhesives," Biomacromolecules, vol. 19., pp. 1425-1434, 2018.

Shah et al., "Non-aqueous, tissue compliant carbene-crosslinking bioadhesives," Materials Science & Engineering C, vol. 100, pp. 215-225, 2019.

* cited by examiner

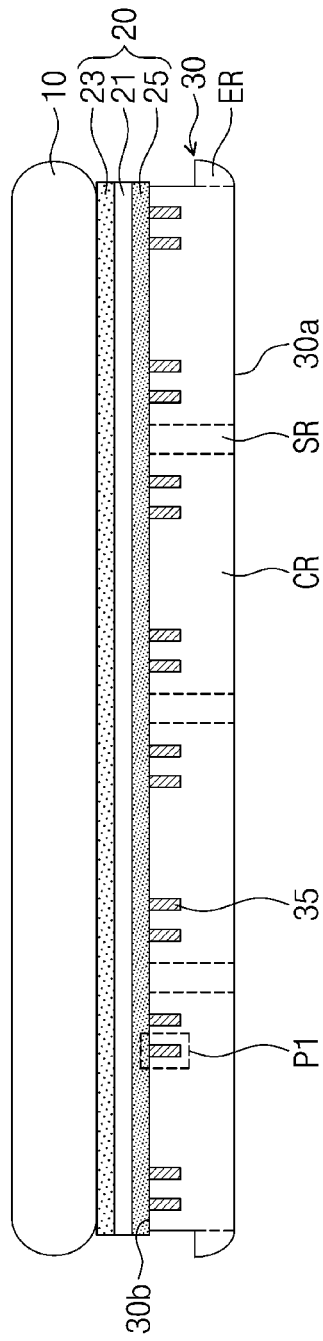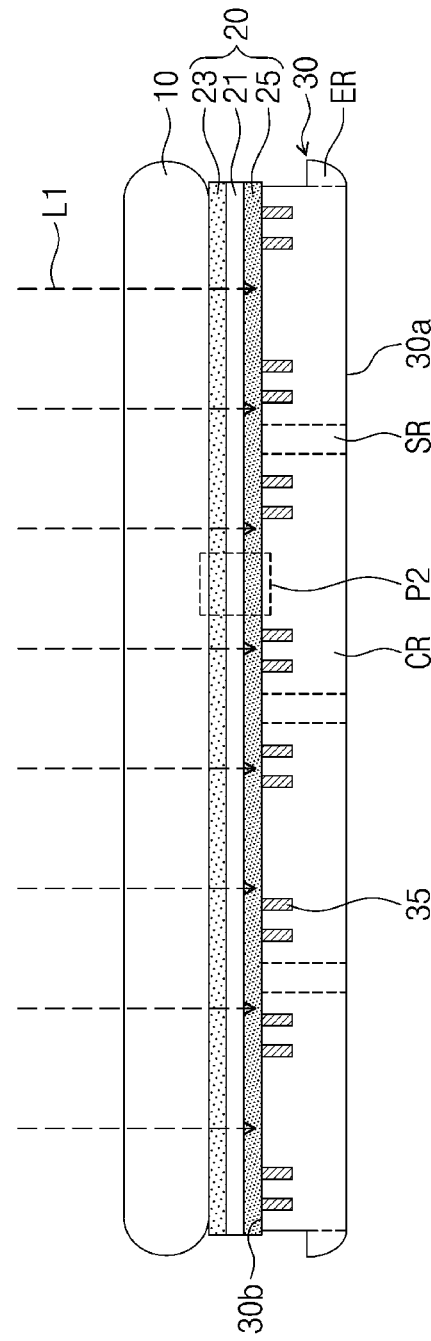

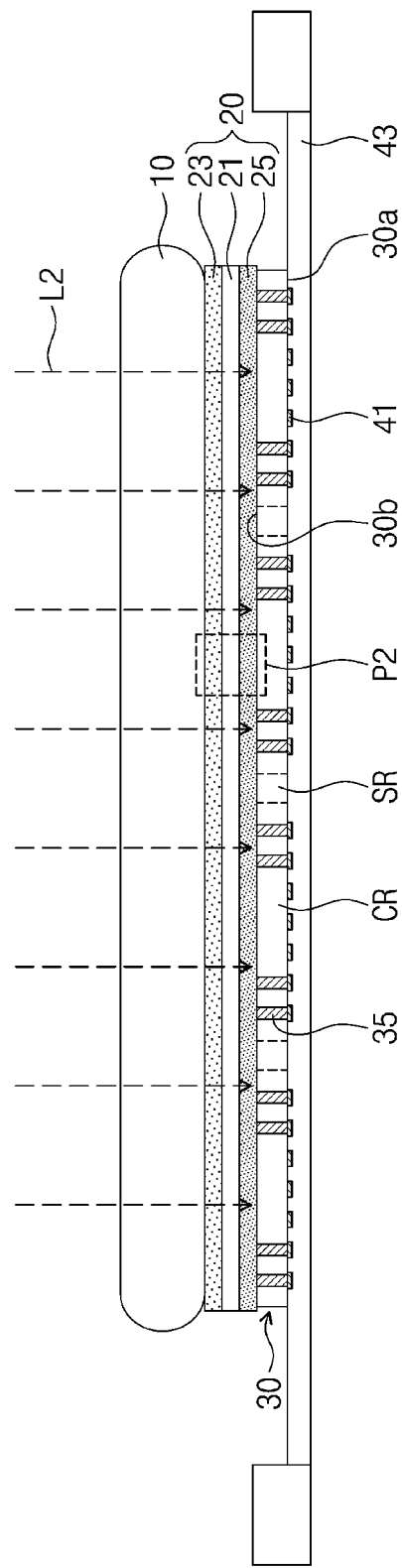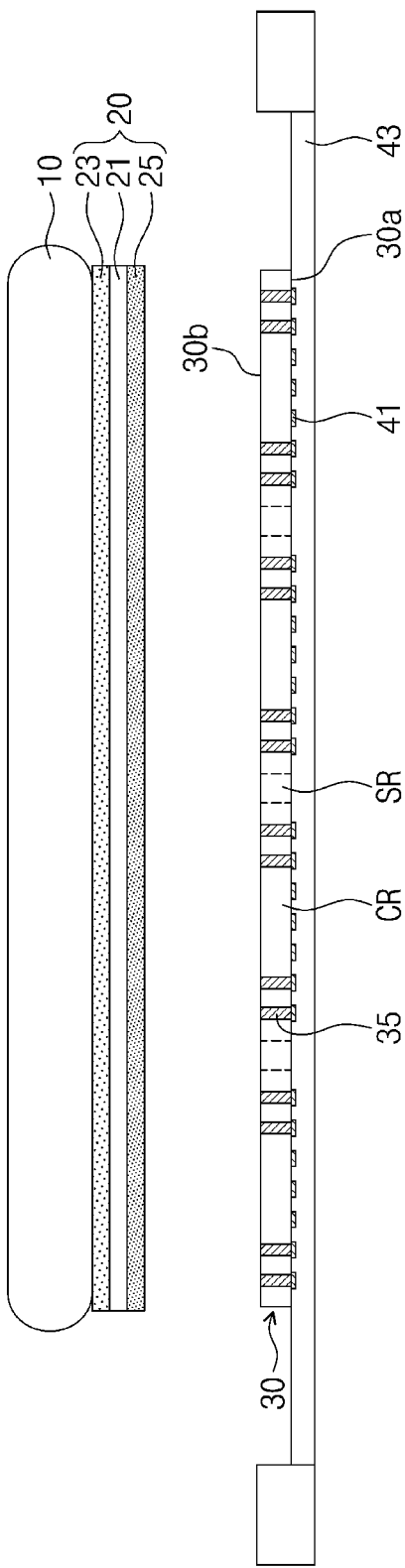

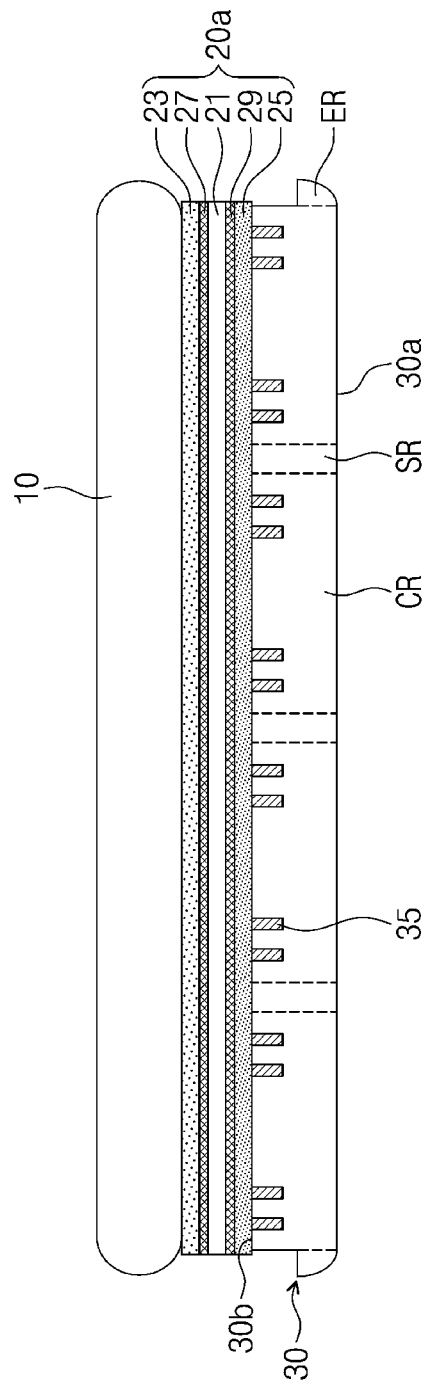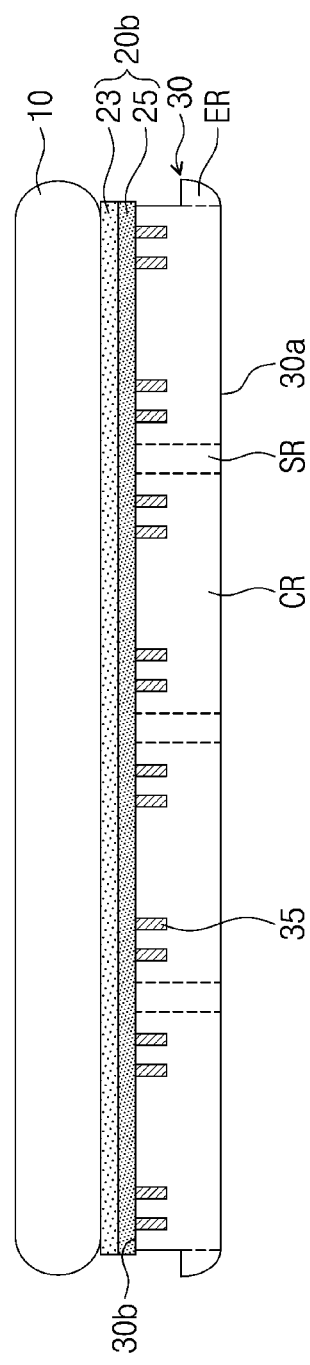

METHOD OF MANUFACTURING SEMICONDUCTOR DEVICE USING GAS BLOWING AGENT

CROSS-REFERENCE TO RELATED APPLICATIONS

This U.S. non-provisional patent application claims priority under 35 U.S.C. § 119 to Korean Patent Application No. 10-2021-0117324, filed on Sep. 3, 2021, the entire contents of which are hereby incorporated by reference.

BACKGROUND

The present disclosure herein relates to a method for manufacturing a semiconductor device, and more particularly, to a method for manufacturing a semiconductor device using a gas blowing agent.

With the development of electronics industry, electronic components are required to have higher-level functions, higher speed, and smaller size. To support this trend, the size of a semiconductor chip may be reduced. To this end, a wafer is processed to reduce its thickness through a back grinding process or the like during a semiconductor manufacturing process. However, a crack may occur in a wafer during a semiconductor memory device manufacturing process, thus causing a reduction in yield.

SUMMARY

The present disclosure provides a method of manufacturing a semiconductor device capable of improving yield.

The purposes of the present disclosure are not limited to the above-mentioned purposes, and other purposes not mentioned will be understood by those skilled in the art from the disclosure below.

An embodiment of the inventive concept provides a method for manufacturing a semiconductor device, including bonding a carrier substrate onto a device wafer with an adhesive member, wherein the adhesive member includes a base film, a device adhesive film disposed on a first (e.g., lower) surface of the base film and contacting the device wafer, and a carrier adhesive film disposed on a second (e.g., upper) surface of the base film and contacting the carrier substrate, wherein the device adhesive film includes a gas blowing agent, and the carrier adhesive film does not include a gas blowing agent.

In an embodiment of the inventive concept, a method of manufacturing a semiconductor device includes: bonding a carrier substrate onto a device wafer with an adhesive member therebetween; a first curing of the adhesive member by radiating first light of a first wavelength through the carrier substrate; reducing a thickness of the device wafer by performing a back grinding process on the device wafer; a second curing of the adhesive member by radiating second light of a second wavelength that is different from the first wavelength through the carrier substrate, and forming pores between the adhesive member and the wafer substrate; and separating the carrier substrate and the adhesive member from the device wafer.

In an embodiment of the inventive concept, a method of manufacturing a semiconductor device includes: bonding a carrier substrate onto a device wafer with an adhesive member; a first curing the adhesive member by radiating first ultraviolet light of a first wavelength through the carrier substrate; reducing a thickness of the device wafer by performing a back grinding process on the device wafer; a second curing the adhesive member by radiating second ultraviolet light of a second wavelength that is different from the first wavelength through the carrier substrate, and forming pores between the adhesive member and the wafer substrate; and separating the carrier substrate and the adhesive member from the device wafer, wherein the adhesive member includes: a base film; a device adhesive film disposed on a lower surface of the base film and contacting the device wafer; and a carrier adhesive film disposed on an upper surface of the base film and contacting the carrier substrate, wherein the device adhesive film includes a gas blowing agent, and the carrier adhesive film does not include a gas blowing agent.

BRIEF DESCRIPTION OF THE FIGURES

The accompanying drawings are included to provide a further understanding of the inventive concept. In the drawings:

FIGS. 2A to 2H are cross-sectional views illustrating a sequence of steps for manufacturing a semiconductor device according to embodiments of the inventive concept;

FIG. 4 is a cross-sectional view illustrating a method for manufacturing a semiconductor device according to embodiments of the inventive concept;

FIG. 5 is a cross-sectional view illustrating a method for manufacturing a semiconductor device according to embodiments of the inventive concept;

DETAILED DESCRIPTION

Hereinafter, embodiments according to the inventive concept will be described in detail with reference to the drawings.

Figure 1:
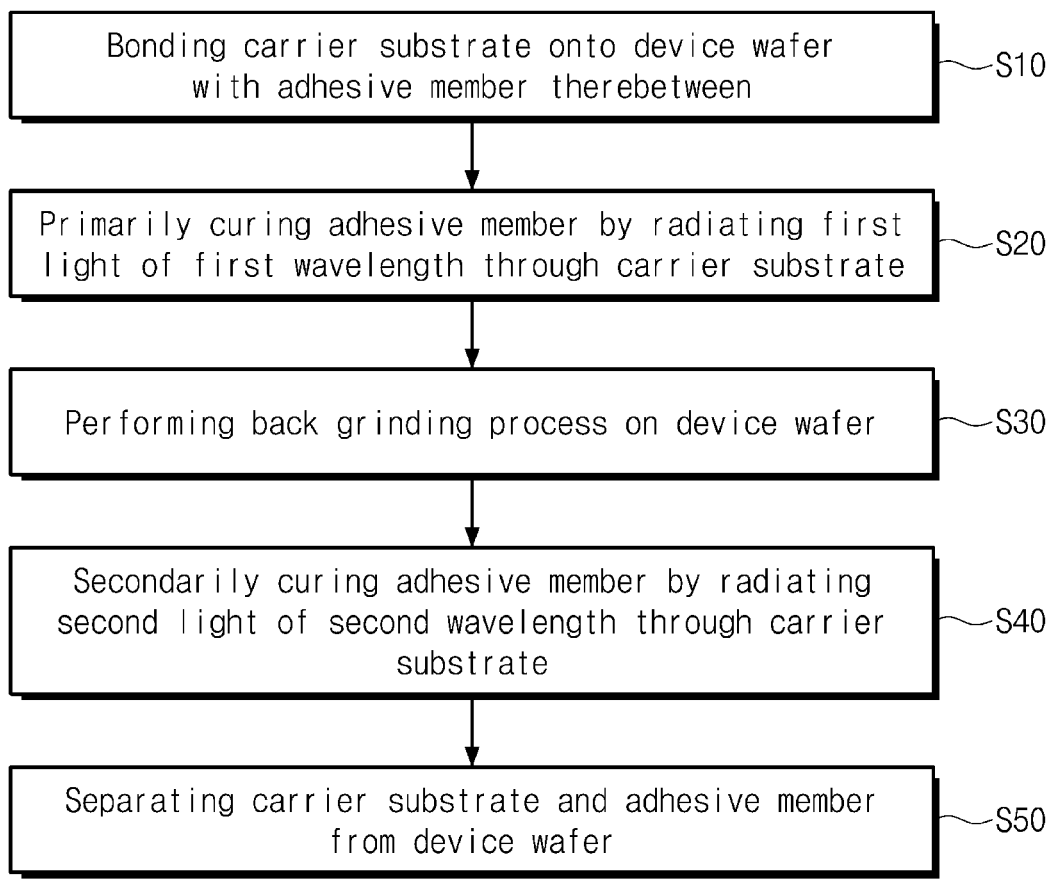
FIG. 1 is a flowchart illustrating a method of manufacturing a semiconductor device according to embodiments of the inventive concept.

FIG. 1 is a flowchart illustrating a method for manufacturing a semiconductor device according to embodiments of the inventive concept. FIGS. 2A to 2H are cross-sectional views sequentially illustrating a method for manufacturing a semiconductor device according to embodiments of the inventive concept. FIG. 3A is an enlarged view of the portion P1 of FIG. 2A according to embodiments of the inventive concept. FIG. 3B is an enlarged view of the portion P2 of FIG. 2B according to embodiments of the inventive concept. FIG. 3C is an enlarged view of the portion P1 of FIG. 2C according to embodiments of the inventive concept. FIG. 3D is an enlarged view of the portion P1 of FIG. 2D according to embodiments of the inventive concept. FIG. 3E is an enlarged view of the portion P2 of FIG. 2E according to embodiments of the inventive concept.

Referring to FIGS. 1 and 2A, a carrier substrate 10, a device wafer 30, and an adhesive member 20 are prepared. The carrier substrate 10 is bonded to the device wafer 30 with the adhesive member 20 (formed therebetween) (first operation, S10).

The carrier substrate 10 may be transparent. For example, the carrier substrate 10 may be formed of glass and allow transmission of light (e.g., ultraviolet light) that may cause a chemical reaction in or otherwise change the characteristics of the adhesive member 20.

The device wafer 30 may have various semiconductor devices are formed therein. The device wafer 30 includes a first surface 30a and a second surface 30b facing away from each other. The first surface 30a may be a backside surface of the device wafer 30 and the second surface 30b may be an active surface of the device wafer 30 (corresponding to active surfaces of the semiconductor devices formed therein). The device wafer 30 includes a plurality of chip regions CR, scribe regions SR therebetween, and a edge region ER at the edge of the device wafer 30. The scribe regions SR may be formed as scribe lanes running in two perpendicular directions (from a top down perspective) to define a grid with chip regions CR forming grid elements of the grid. The edge region ER may form a bezel and may have a height difference with upper portions of the chip regions CR. Each chip region CR may form a semiconductor device that when cut form the device wafer 30 forms a corresponding semiconductor chip.

Referring to FIG. 3A, in detail, the device wafer 30 includes transistors TR formed on and/or in a wafer substrate 30c in the chip regions CR. The wafer substrate 30c may be a crystalline semiconductor (e.g., crystalline Si, Si/Ge, Ge, etc.) and may be selectively doped with charge carrier dopants. The exposed surface of the wafer substrate 30c (lower surface in FIGS. 2A, 2B and 3A) may form the device wafer 30 first surface 30a (e.g., a backside surface of the device wafer 30). Portions of the wafer substrate 30c may form substrates of the semiconductor devices formed in the chip regions CR. FIG. 3A illustrates a transistor TR having a gate (hashed portion) formed on wafer substrate 30c, with a gate dielectric separating the gate from the wafer substrate 30c. As is conventional, the transistor TR may include a channel region (not shown) formed in the substrate 30c and have source/drain regions (not shown) formed on opposite sides of the channel region. The transistors TR are covered with interlayer dielectrics 34 (ILDs). Wirings 33 are arranged between the interlayer dielectrics 34. Each interlayer dielectric 34 may be formed as a single layer or multilayer structure of at least one of SiN, $SiO_2$, SiON, SiOC, tetraethyl orthosilicate (TEOS), high density plasma (HDP) oxide, undoped silicate glass (USG), SiCN, or porous insulating material. The wirings 33 may be formed of a single layer or multiple layers of metal such as tungsten, aluminum, copper, titanium, tantalum, ruthenium, and/or iridium. Each layer of wirings 33 may comprise a plurality of separately formed wirings 33 that are interconnected to other corresponding wirings 33 of other layer of wirings 33 to interconnect various transistors TR to each other (to form logic devices and interconnections between logic devices to form an integrated circuit of the corresponding semiconductor device) as well as to interconnect external terminals of the semiconductor device to the integrated circuit (e.g., to provide power and communicate signals between the semiconductor device and an external device).

FIG. 3C illustrates structure for forming a through substrate via (TSV) 35 penetrates a portion of the wafer substrate 30c and a lowermost interlayer dielectric 34 among the interlayer dielectrics 34. Upon further processing (e.g., as shown in FIG. 3C and described below), the through substrate vias 35 fully penetrate the wafer substrate 30c (e.g., after thinning the wafer substrate 30c). The through substrate via 35 may contact a lowermost wiring 33 among the wirings 33. The through substrate via 35 may be formed of metal such as copper and tungsten. A diffusion barrier film 32 and a via insulating film 31 may be conformally arranged between the through substrate via 35 and the wafer substrate 30c and between the through substrate via 35 and the interlayer dielectric 34. The diffusion barrier film 32 and the via insulating film 31 may cover a lower surface of the through substrate via 35. The via insulating film 31 may be spaced apart from a lower surface of the wafer substrate 30c. The diffusion barrier film 32 may include, for example, at least one of titanium, tantalum, titanium nitride, tantalum nitride, or tungsten nitride. The via insulating film 31 may include, for example, a silicon oxide. Alternative structures and processes for forming the through substrate vias 35 are also applicable, such as through substrate vias 35 that fully penetrate the entire semiconductor device (to extend to second surface 30b). When the wafer substrate 30c is formed of silicon, the through substrate vias 35 may be referred to as through silicon vias 35.

A first conductive pad 36 is disposed on an uppermost interlayer dielectric 34. First conductive pads 36 may be chip pads formed at the outermost surface of the device wafer 30 and form external terminals of the semiconductor devices. The uppermost interlayer dielectric 34 and a portion of the first conductive pad 36 are covered with a first passivation film 37. The first passivation film 37 may form an outermost layer of the semiconductor devices and form second surface 30b. The first passivation film 37 may initially cover the first conductive pads 36, and then patterned to form corresponding holes in the first passivation film 37 that expose corresponding first conductive pads 36 for connecting the semiconductor devices to external devices. For example, FIG. 3A illustrates a first conductive bump 38 which may be disposed on and contact the first conductive pad 36 through a hole in the first passivation film. The first conductive bump 38 may be formed of tin, lead, copper, or the like. The first conductive bump 38 may include at least one of a copper bump, copper pillar, or solder ball. The first conductive bump 38 may protrude above the first passivation film 37 so that the second surface 30b may have a protrusion-and-recess structure. Alternatively, an upper surface of the first conductive bump 38 may be coplanar with an upper surface of the first passivation film 37, and the second surface 30b may be even. Alternatively, the conductive bump 38 may be added at a later time, such as after separating the semiconductor devices (e.g., singulating the wafer).

Although FIG. 3A illustrates the through substrate via 35 as contacting the lowermost wiring 33, the through substrate via 35 may contact the wiring 33 of another layer, may have an upper surface having the same height as an upper surface of the wafer substrate 30c, or fully extend through the device wafer 30 and terminate at the second surface 30b.

Referring back to FIG. 2A, the adhesive member 20 is a multi-layered film and may include a base film 21, a carrier adhesive film 23 contacting an upper surface of the base film 21 and contacting the carrier substrate 10, and a device adhesive film 25 contacting a lower surface of the base film 21 and contacting the device wafer 30. The adhesive member 20, for example, may be a double sided tape. That is, the adhesive member 20 may be provided in a form in which two sides of the base film 21 are respectively coated with the carrier adhesive film 23 and the device adhesive film 25. The carrier adhesive film 23 may have a thickness of about 10 nm to about 500 μm. The base film 21 may have a thickness of about 10 nm to about 500 μm. The device adhesive film 25 may have a thickness of about 10 nm to about 500 μm.

The base film 21 may serve to support the carrier adhesive film 23 and the device adhesive film 25. The base film 21 may absorb light of a wavelength of about 300 nm or less.

Since the base film 21 is provided, the adhesive member 20 may be easily handled, and a wafer support system (WSS) process may be performed with ease. The base film 21, for example, may be transparent to allow ultraviolet light to be transmitted therethrough. The base film 21 may be insensitive to may not react with light within a certain wavelength, such as being insensitive to ultraviolet light. The base film 21, for example, may be a polymer film such as polypropylene (PP), polyethylene (PE), polyvinyl chloride (PVC), polyethylene terephthalate (PET), and polyimide (PI).

The carrier adhesive film 23 may include a first resin, a first cross-linking agent, a first filler, and a first release agent so as to have appropriate bonding force on a surface of the carrier substrate 10. The device adhesive film 25 may include a second resin, a second cross-linking agent, a second filler, and a second release agent so as to have appropriate bonding force to a surface of the device wafer 30. The first resin and the second resin may be the same or different from each other. The first resin and the second resin, for example, may be an acrylate-based polymer. The first resin and the second resin, for example, may have a structure of Chemical Formula 1 below.

<Chemical Formula 1>

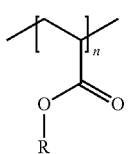

In Chemical Formula 1, n denotes an arbitrary natural number, and R may denote one of hydrogen, alkyl group, alkenyl group, and alkanyl group.

The first cross-linking agent and the second cross-linking agent may be the same or different from each other. The first cross-linking agent and the second cross-linking agent, for example, may be cyanate-based. The first cross-linking agent and the second cross-linking agent, for example, may individually have one of structure I and structure II of Chemical Formula 2 below.

<Chemical Formula 2>

$$OCN-R-NCO \quad (I)$$

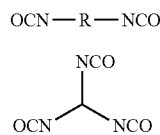 (II)

In Chemical Formula 2, R may denote one of hydrogen, alkyl group, alkenyl group, and alkanyl group. Bonding force of the carrier adhesive film 23 and the device adhesive film 25 may be adjusted according to content of the first cross-linking agent and the second cross-linking agent.

The first filler and the second filler may be the same or different from each other. The first filler and the second filler, for example, may be silica, alumina, ceria, or titania. The first filler and the second filler may be added to adjust mechanical strength or modulus of the carrier adhesive film 23 and the device adhesive film 25.

The first release agent and the second release agent may be the same or different from each other. The first release agent and the second release agent, for example, may be silicone acrylate. The first release agent and the second release agent, for example, may have a structure of Chemical Formula 3 below.

<Chemical Formula 3>

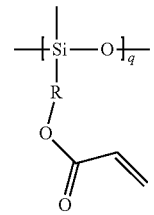

In Chemical Formula 3, q denotes an arbitrary natural number, and R may denote one of alkyl group, alkenyl group, and alkanyl group. In Chemical Formula 3, a silicon-bonded part is hydrophobic, and thus may deteriorate adhesive strength. The first release agent and the second release agent may be added to adjust adhesive strength of the carrier adhesive film 23 and the device adhesive film 25.

The device adhesive film 25 may further include a gas blowing agent. On the contrary, the carrier adhesive film 23 may not include the gas blowing agent. The gas blowing agent may be a material (or photoinitiator), which is decomposed by light of a specific wavelength causing formation of a gas, such as formation of nitrogen gas. A highly reactive radical may also be formed during such decomposition.

The gas blowing agent may be diazirine. As shown in Chemical Reaction Formula 1 below, the diazirine, for example, may be decomposed by ultraviolet light of a wavelength W2 of about 350 nm to about 400 nm, more specifically, about 355 nm, thus forming nitrogen ($N_2$) gas and a carbene radical.

<Chemical Reaction Formula 1>

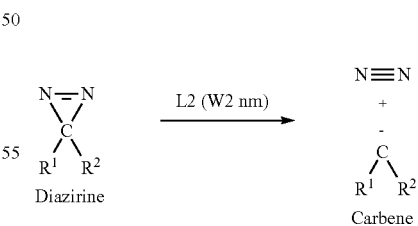

In Chemical Reaction Formula 1, R1 and R2 of the diazirine may individually denote one of hydrogen, alkyl group, alkenyl group, and alkanyl group.

The carrier adhesive film 23 may include the first resin in an amount of about 80-99 wt % based on a total weight of the carrier adhesive film 23. The carrier adhesive film 23 may include the first cross-linking agent in an amount of about 0.001-1 wt % based on the total weight of the carrier adhesive film 23. The carrier adhesive film 23 may include the first filler in an amount of about 0.001-1 wt % based on the total weight of the carrier adhesive film 23. The carrier adhesive film 23 may include the first release agent in an amount of about 0.001-1 wt % based on the total weight of the carrier adhesive film 23.

The device adhesive film 25 may include the second resin in an amount of about 80-99 wt % based on a total weight of the device adhesive film 25. The device adhesive film 25 may include the second cross-linking agent in an amount of about 0.001-1 wt % based on the total weight of the device adhesive film 25. The device adhesive film 25 may include the second filler in an amount of about 0.001-1 wt % based on the total weight of the device adhesive film 25. The device adhesive film 25 may include the second release agent in an amount of about 0.001-1 wt % based on the total weight of the device adhesive film 25. The device adhesive film 25 may include the gas blowing agent in an amount of about 0.001-1 wt % based on the total weight of the device adhesive film 25.

Referring to FIGS. 1, 2B, and 3B, the adhesive member 20 is primarily cured by being irradiated with first light L1 of a first wavelength W1 through the carrier substrate 10 (second operation, S20). Adhesive strength of the adhesive member 20 between the carrier substrate 10 and the device wafer 30 may be reinforced due to the primary curing.

In detail, the first light L1 of the first wavelength W1 is radiated to the adhesive member 20 through the carrier substrate 10 in a state in which the carrier substrate 10 and the device wafer 30 are bonded to each other with the adhesive member 20 therebetween. The gas blowing agent may be substantially insensitive to the light of the first wavelength W1 so that it does not decompose and form gas upon exposure to light of the first wavelength. The first wavelength W1 may be about 300 nm to about 349 nm, and the first light L1 may be ultraviolet light. Accordingly, in the carrier adhesive film 23 and the device adhesive film 25 of the adhesive member 20, a primary curing reaction may occur, in which the first light L1 causes the first cross-linking agent and the second cross-linking agent to cross link the first resin and the second resin. In detail, due to the primary curing reaction, first polymer chains PB1 of the first resin may be connected by first cross-linking groups BC1 of the first cross-linking agent in the carrier adhesive film 23. Furthermore, due to the primary curing reaction, second polymer chains PB2 of the second resin may be connected by second cross-linking groups BC2 of the second cross-linking agent in the device adhesive film 25. Particles of the gas blowing agent GA may be dispersed between the second polymer chains PB2 and the second cross-linking groups BC2 in the device adhesive film 25. Due to the primary curing reaction, modulus of the carrier adhesive film 23 and the device adhesive film 25 of the adhesive member 20 may increase, and the adhesive member 20 may securely fix the device wafer 30 to the carrier substrate 10.

Figure 2C:
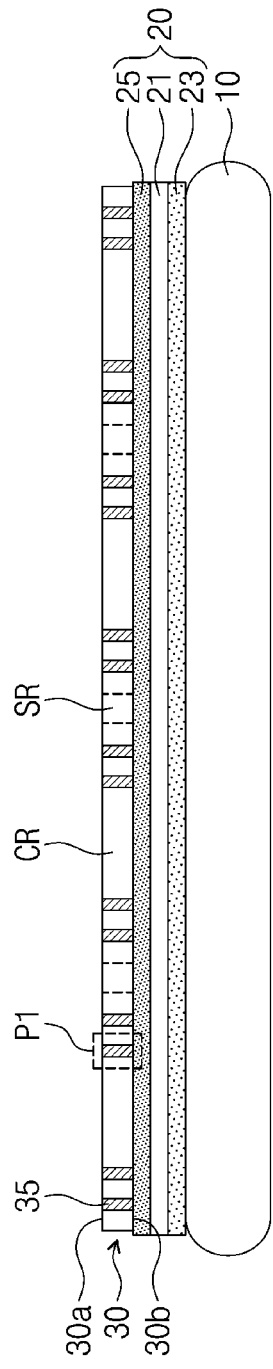
Figure 2D:
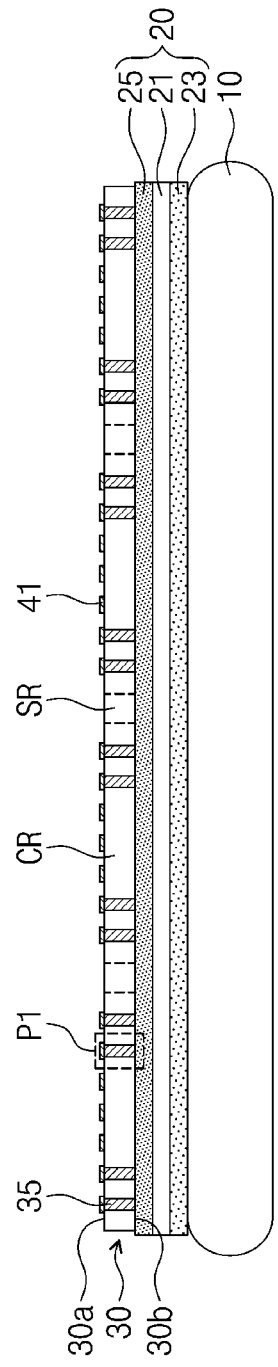
Figure 3A:
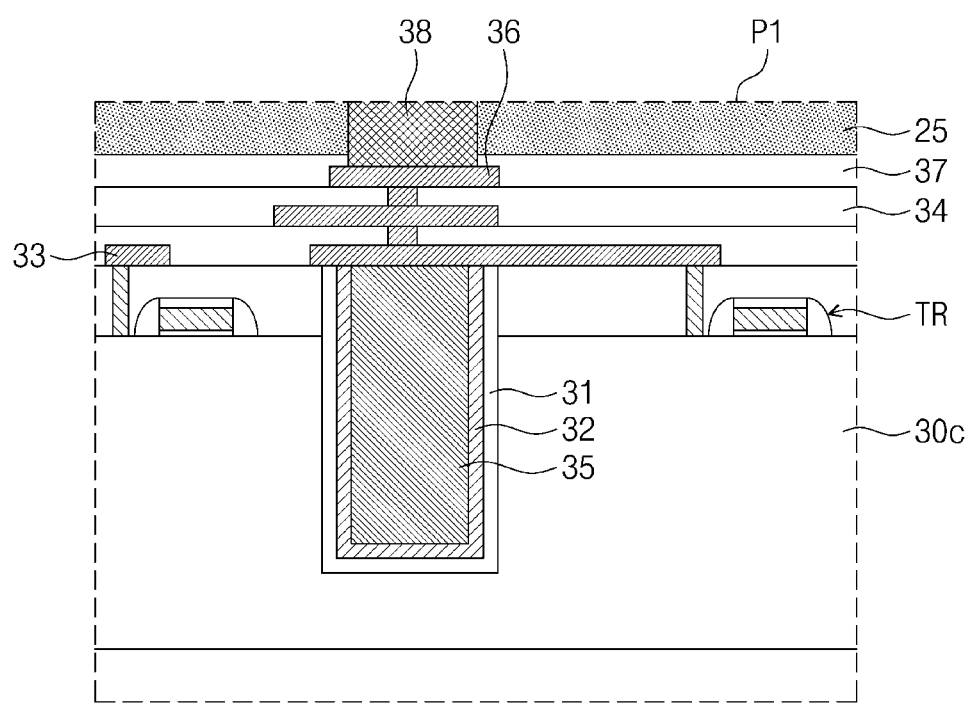
FIG. 3A is an enlarged view of the portion P1 of FIG. 2A according to embodiments of the inventive concept.
Figure 3B:
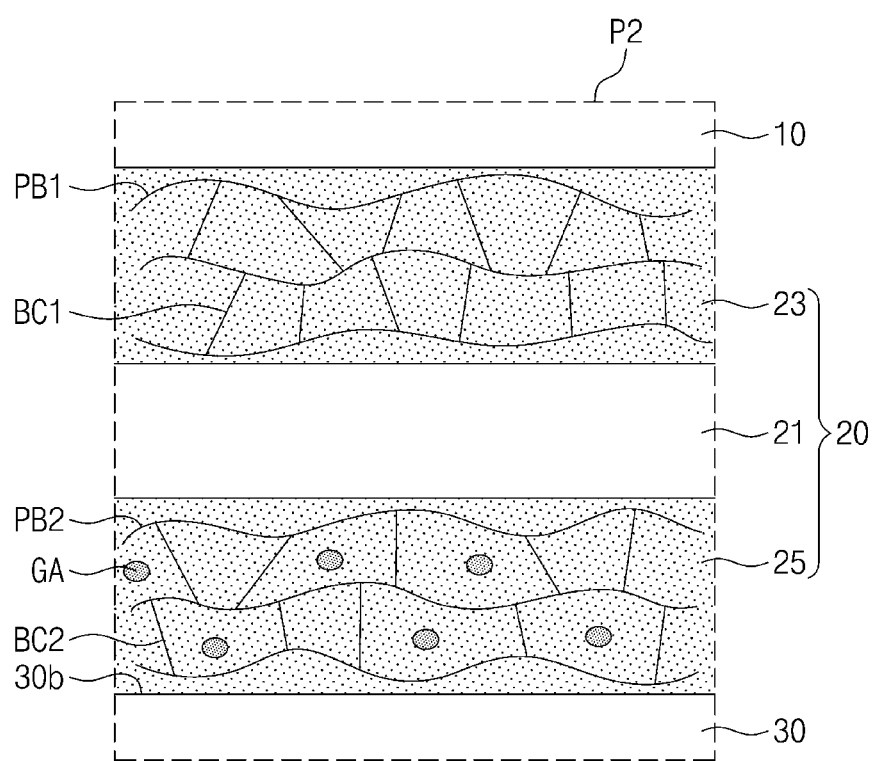
FIG. 3B is an enlarged view of the portion P2 of FIG. 2B according to embodiments of the inventive concept.
Figure 3C:
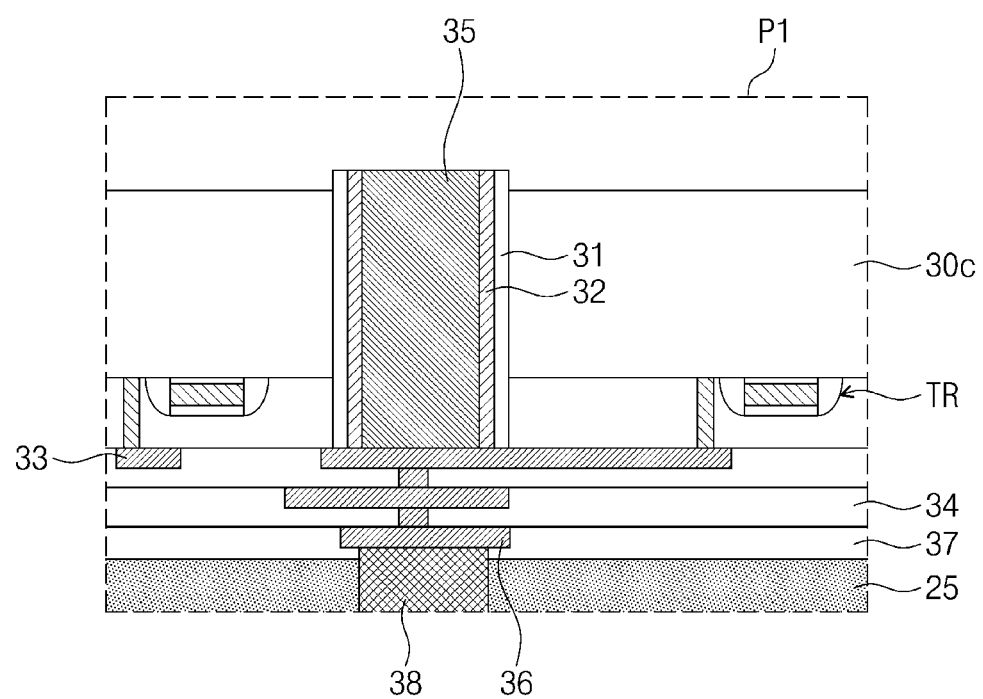
FIG. 3C is an enlarged view of the portion P1 of FIG. 2C according to embodiments of the inventive concept.
Figure 3D:
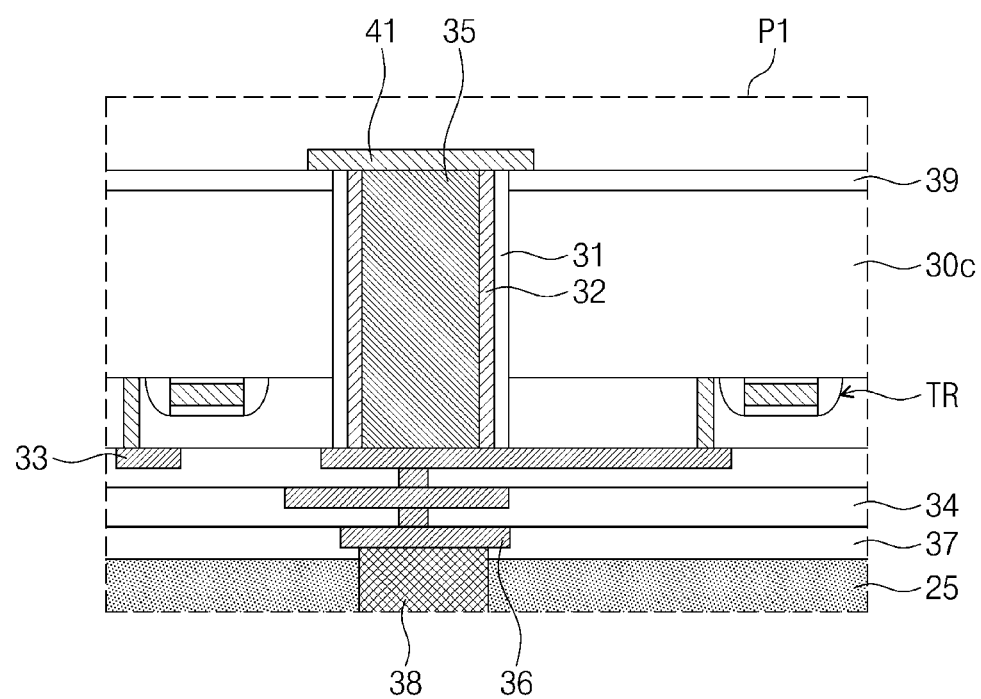
FIG. 3D is an enlarged view of the portion P1 of FIG. 2D according to embodiments of the inventive concept.
Figure 3E:
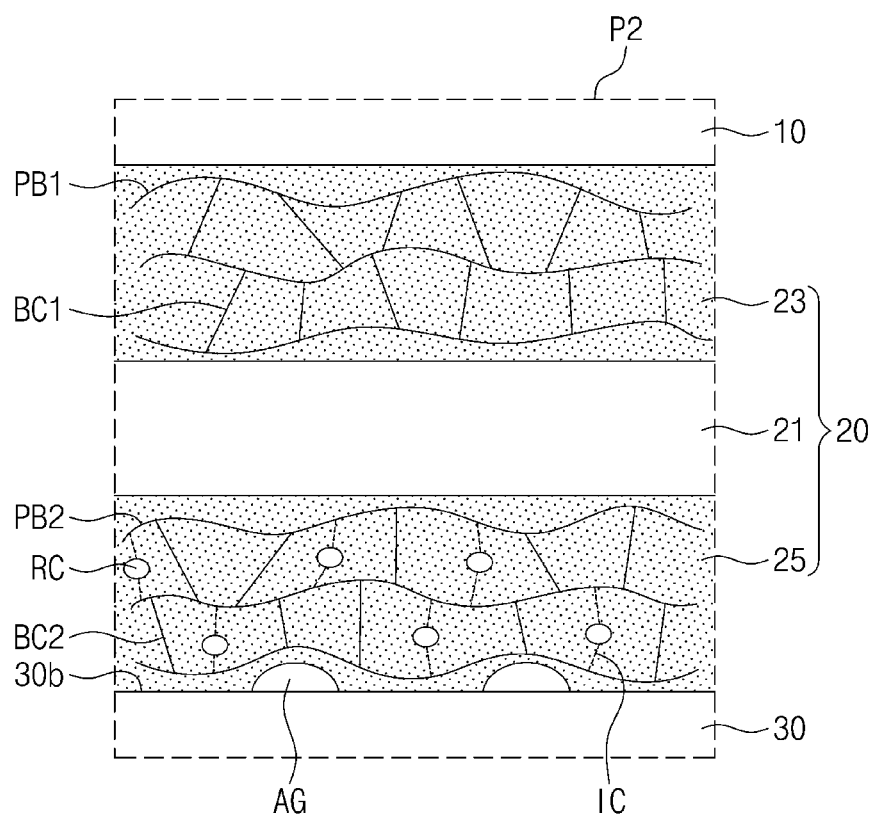
FIG. 3E is an enlarged view of the portion P2 of FIG. 2E according to embodiments of the inventive concept.

Referring to FIGS. 1, 2B, 2C, 3A, and 3C, a back grinding process is performed on the device wafer 30 (third operation, S30). In detail, the back grinding process is performed in an overturned state in which the first surface 30a of the device wafer 30 faces upwards (as shown in FIGS. 2C and 2D) so as to remove a portion of the wafer substrate 30c adjacent to the first surface 30a of the device wafer 30 (e.g., removal of a predetermined thickness of the wafer substrate 30c). Accordingly, a portion of the wafer substrate 30c, a portion of the via insulating film 31, and a portion of the diffusion barrier film 32 may be removed, and the through substrate via 35 may be exposed. Here, the bezel part of edge region ER may also be removed. A sidewall of the insulating film 31 may be partially exposed by etching back a portion of the wafer substrate 30c. The first surface 30a of the of the device wafer 30 may change its configuration during the manufacturing process, such as after the back grinding process.

Referring to FIGS. 2D and 3D, a second passivation film 39 is formed on a back side of the wafer substrate 30c. Furthermore, a second conductive pad 41 is formed in contact with the through substrate via 35. Although not illustrated, a process of forming a bump or rewiring contacting the second conductive pad 41 may be performed as a follow-up process.

The device wafer 30 is separated from the carrier substrate 10 when an additional process is not required after performing a pad forming process and back grinding process on the first surface 30a of the device wafer 30. This will be described in detail with reference to FIGS. 1, 2E, and 2F.

Referring to FIG. 2E, the device wafer 30 to which the carrier substrate 10 is attached is placed on, for example, a chip bonding tape 43. Here, the first surface 30a of the device wafer 30 is brought into contact with the chip bonding tape 43.

Referring to FIGS. 1 and 2E, the adhesive member 20 is secondarily cured by being irradiated with second light L2 of a second wavelength W2 through the carrier substrate 10 (fourth operation, S40). Adhesive strength between the device wafer 30 and the adhesive member 20 may decrease due to the irradiation of the second light L2 radiated during secondary curing.

In detail, the second light L2 of the second wavelength W2 is radiated to the adhesive member 20 through the carrier substrate 10. The second wavelength W2 may be different from the first wavelength W1 of the first light L1 of FIG. 2B. For example, the second wavelength W2 may be greater than the first wavelength W1, such as the second wavelength W2 being about 350 nm to about 400 nm. The second light L2 may be ultraviolet light.

Referring to FIGS. 2E, 3B, and 3E, the gas blowing agent GA included in the device adhesive film 25 may be decomposed, thus forming nitrogen ($N_2$) gas and radicals RC. The radicals RC further cross link the second polymer chains PB2 in the device adhesive film 25 so that internal bonds IC are formed between the second polymer chains and the radicals RC and so that the second polymer chains PB2 are further bonded to each other though the radicals RC (e.g., increasing the cross-linking of the second polymer chains PB2). Accordingly, a secondary curing process progresses in the device adhesive film 25, and this may be expressed by Chemical Reaction Formula 2.

<Chemical Reaction Formula 2>

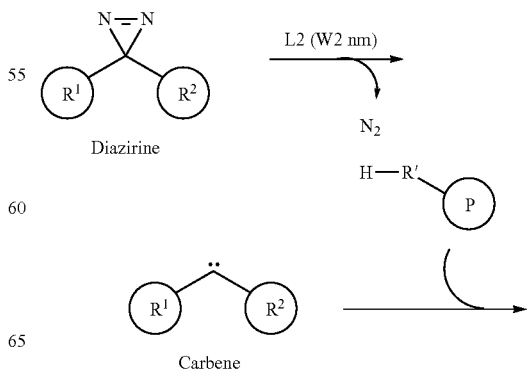

-continued

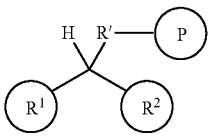

In Chemical Reaction Formula 2, diazirine that is the gas blowing agent may be decomposed to nitrogen (N₂) gas and carbene that is a radical as shown in Chemical Reaction Formulas 1 and 2.

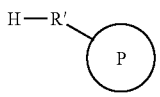

of Chemical Reaction Formula 2 may correspond to the second resin included in the device adhesive film 25. In

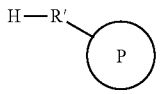

of Chemical Reaction Formula 2, P may denote a functional group, and R' may denote alkyl group, alkenyl group, or alkanyl group. The functional group may be a hydroxyl group, carboxyl group, or the like. The carbene is bonded to the second polymer chains PB2 of the second resin. That is, the carbene may form a new C—C bond by reacting with carbon and/or hydrogen of the second resin.

Therefore, a cross-linking degree/curing degree of the device adhesive film 25 may further increase, and thus the modulus of the device adhesive film 25 may increase, the adhesive film 25 stays together so that the entire adhesive film 25 is removed with removal of the carrier substrate 10. Furthermore, the nitrogen gas may form pores AG (gaps filled with nitrogen gas, which may also be referred to herein as airgaps) between the device adhesive film 25 and the device wafer 30, and thus the adhesive strength between the device adhesive film 25 and the device wafer 30 may be reduced. As shown in FIG. 3E, the pores AG may be formed along the second surface 30b of the device wafer 30, and thus the pores AG may reduce the surface area of second surface 30b that is in contact with device adhesive film 25. Accordingly, the adhesive strength between the adhesive member 20 and the device wafer 30 may be reduced.

On the contrary, since the carrier adhesive film 23 does not include the gas blowing agent GA, Chemical Reaction Formulas 1 and 2 do not occur in the the carrier adhesive film 23. Therefore, the secondary curing process does not occur in the carrier adhesive film 23. Therefore, adhesive strength between the carrier adhesive film 23 and the carrier substrate 10 is not reduced.

Referring to FIGS. 1 and 2F, the adhesive member 20 and the carrier substrate 10 are separated from the device wafer 30 (fifth operation, S50). As described above, since the adhesive strength between the adhesive member 20 and the device wafer 30 has been reduced, the adhesive member 20 and the carrier substrate 10 may be easily separated from the device wafer 30. Accordingly, a crack does not occur in the device wafer 30. Furthermore, the combination of the carrier substrate and the adhesive member may be removed together with this separation step (S50) (the carrier substrate and the adhesive member are attached to each other during and immediately after separating from the device wafer) improving the speed of this peel-off process.

As semiconductor devices are decreased in size, a thickness of the device wafer 30 is decreased, and thus the device wafer 30 may be more vulnerable to a crack. However, a crack or edge chipping of the device wafer 30 or tearing of a passivation film may be minimized/prevented by using a semiconductor device manufacturing method according to the inventive concept. Accordingly, yield may be improved since the device wafer 30 does not break. Furthermore, accordingly, a speed of a separation process or peel-off process may be improved, and thus the yield may be further improved.

Figure 2G:
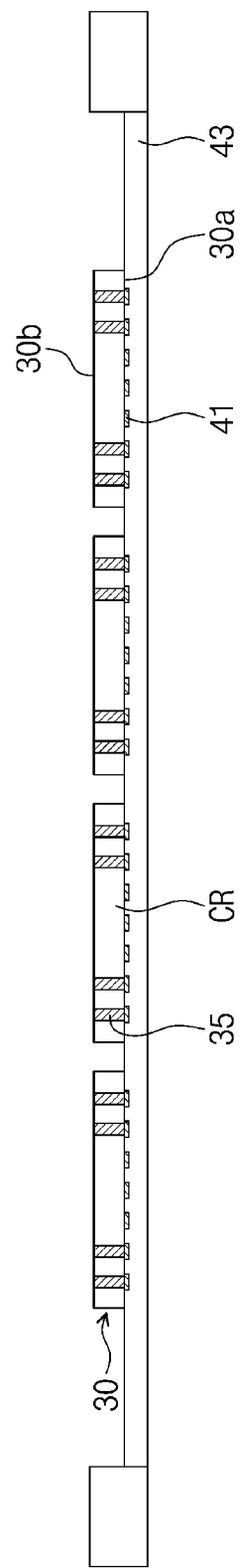
Figure 2H:
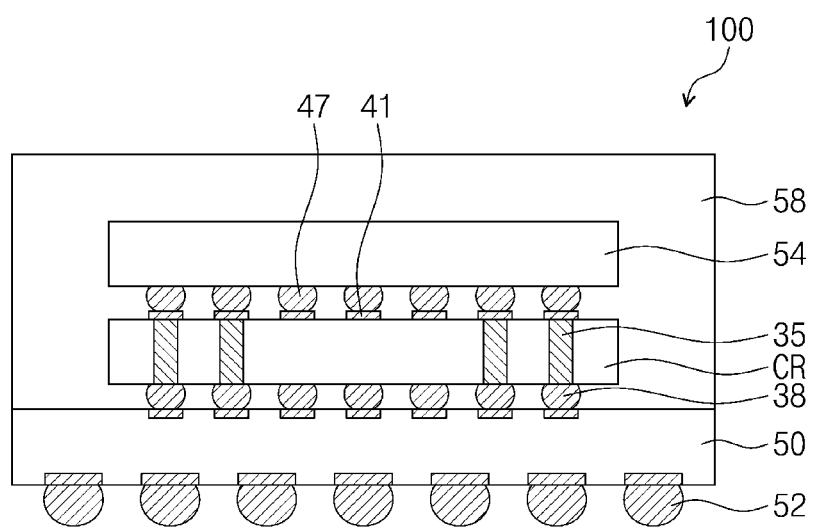

Referring to FIG. 2G next, the chip regions CR (and the semiconductor devices formed in the chip regions CR) are separated from each other by cutting the wafer along the scribe regions SR, such as by performing a sawing process or other singulation process, thus forming a plurality of semiconductor chips. In some examples, if not formed previously, the first conductive bumps 38 may be attached to the first conductive pads to the device wafer 30 prior to the chip region CR separation (e.g., to structure corresponding to that shown in FIG. 2F) or after chip region CR separation (e.g., to structure corresponding to that shown in FIG. 2G). Referring to FIG. 2H, the separated chip regions CR are mounted on a package substrate 50 in a flip chip bonding manner, for example. The package substrate 50 may be a printed circuit board or rewiring substrate. The chip region CR may form a first semiconductor chip CR. A second semiconductor chip 54 is mounted on the first semiconductor chip CR in a flip chip bonding manner using an internal solder balls 47. A mold film 58 covering the first semiconductor chip CR and the second semiconductor chip 54 is formed by performing a mold process. Furthermore, a semiconductor package 100 is formed by attaching an external solder ball 52 to a lower portion of the package substrate 50. Although a single first semiconductor chip CR is illustrated in FIG. 2G, several such first semiconductor chips CR may be provided, such as by being stacked between the package substrate 50 and the second semiconductor chip 54.

FIG. 4 is a cross-sectional view illustrating a method for manufacturing a semiconductor device according to embodiments of the inventive concept.

Referring to FIG. 4, an adhesive member 20a may further include a first adhesive auxiliary film 27 and a second adhesive auxiliary film 29 in the structure of the adhesive member 20 of FIG. 2A. The first adhesive auxiliary film 27 may be disposed between the base film 21 and the carrier adhesive film 23, and may improve adhesive strength between the base film 21 and the carrier adhesive film 23. The second adhesive auxiliary film 29 may be disposed between the base film 21 and the device adhesive film 25, and may improve adhesive strength between the base film 21 and the device adhesive film 25. The first adhesive auxiliary film 27 may include the first resin, the first cross-linking agent, and the first filler, that are described above with reference to FIG. 2A. The first adhesive auxiliary film 27 may not include the first release agent and the gas blowing agent, as described above with reference to FIG. 2A. The second adhesive auxiliary film 29 may include the second resin, the second cross-linking agent, and the second filler, as described above with reference to FIG. 2A. The second adhesive auxiliary film 29 may not include the second release agent and the gas blowing agent, as described above with reference to FIG. 2A.

After bonding as illustrated in FIG. 4, processes may be performed as described above with reference to FIGS. 1, 2A to 2H, and 3A to 3E. The first adhesive auxiliary film 27 and the second adhesive auxiliary film 29 may also be cured in the primary curing operation (second operation, S20) of FIG. 1, thus increasing their adhesive strength. However, in the secondary curing operation (fourth operation, S40) of FIG. 1, the first adhesive auxiliary film 27 and the second adhesive auxiliary film 29 may not be further cured, and there may be no change in adhesive strength of the first and second adhesive auxiliary films 27, 29. Other matters may be the same as or similar to the above descriptions.

FIG. 5 is a cross-sectional view illustrating a method for manufacturing a semiconductor device according to embodiments of the inventive concept.

Referring to FIG. 5, an adhesive member 20b may not include the base film 21 in the structure of the adhesive member 20 of FIG. 2A. The adhesive member 20b may include the device adhesive film 25 and the carrier adhesive film 23, which are sequentially laminated. In this case, sequentially coating the device adhesive film 25 and the carrier adhesive film 23 on the device wafer 30 may be added before the bonding (first operation, S10) of the carrier substrate 10 onto the device wafer 30 with the adhesive member 20b therebetween. Thereafter, processes may be performed as described above with reference to FIGS. 1, 2A to 2H, and 3A to 3E. Other matters may be the same as or similar to the above descriptions.

Figure 6:
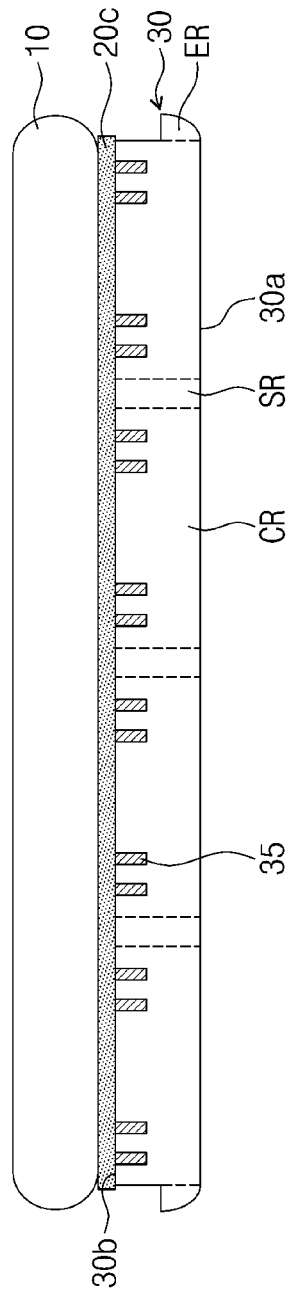
FIG. 6 is a cross-sectional view illustrating a method for manufacturing a semiconductor device according to embodiments of the inventive concept.

FIG. 6 is a cross-sectional view illustrating a method for manufacturing a semiconductor device according to embodiments of the inventive concept.

Referring to FIG. 6, an adhesive member 20c is formed as a single-layer adhesive film. The adhesive member 20c according to the present example may not include the base film 21 nore the carrier adhesive film 23 in the structure of the adhesive member 20 of FIG. 2A. That is, the adhesive member 20c according to the present example may have the same components and composition as the device adhesive film 25 described above with reference to FIG. 2A. That is, the adhesive member 20c may include a resin, the second cross-linking agent, the second filler, the second release agent, and the gas blowing agent. In this case, coating the adhesive member 20c on the device wafer 30 may be added before the bonding (first operation, S10) of the carrier substrate 10 onto the device wafer 30 with the adhesive member 20c therebetween. Thereafter, processes may be performed as described above with reference to FIGS. 1, 2A to 2H, and 3A to 3E. The adhesive member 20c may be disposed between and directly contact the device wafer 30 and the carrier substrate 10. In the present example, the adhesive member 20c is primarily cured in the second operation (S20), and after the back grinding process (third operation, S30) and the pad forming process, the adhesive member 20c is secondarily cured in the fourth operation (S40), and thus has reduced adhesive strength and may be separated from the device wafer 30 without causing a crack (fifth operation, S50). Other matters may be the same as or similar to the above descriptions.

Figure 7:
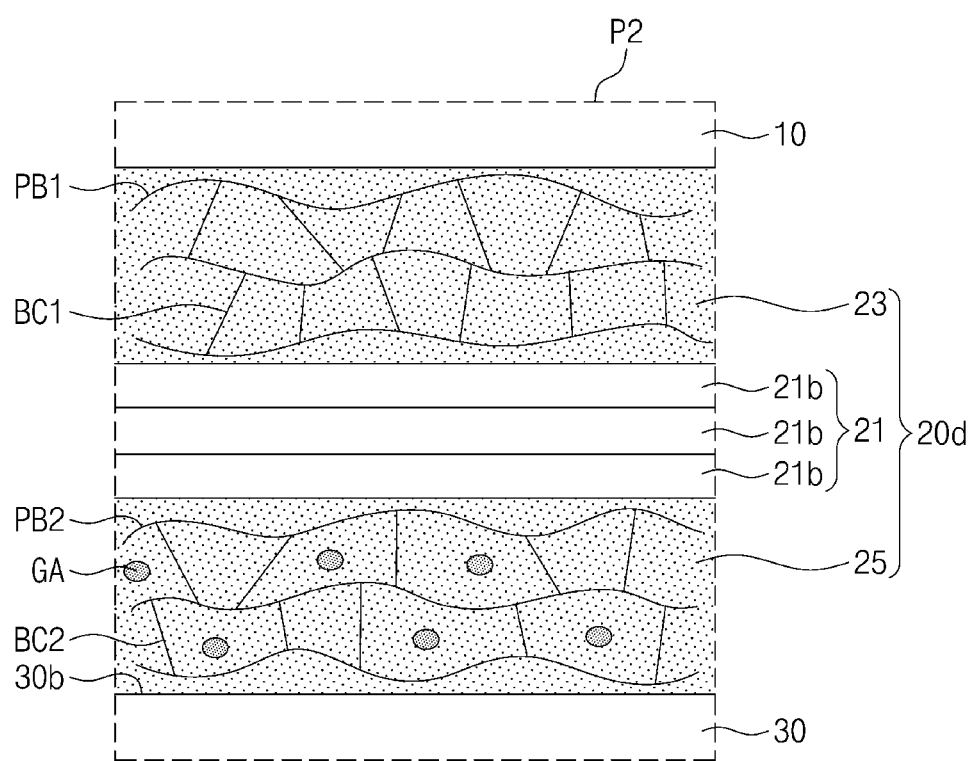
FIG. 7 is an enlarged view of the portion P2 of FIG. 2B according to embodiments of the inventive concept.

FIG. 7 is an enlarged view of the portion P2 of FIG. 2B according to embodiments of the inventive concept.

Referring to FIG. 7, the base film 21 may be a multi-layer film comprising several films having different Young's modulus, toughness, and elongation. In a specific example, the base film 21 of an adhesive member 20d may include first to third base films 21a, 21b, and 21c sequentially laminated. The first to third base films 21a, 21b, and 21c may have different Young's modulus, toughness, and elongation. Accordingly, the WSS process may be performed more stably. Other configurations and methods may be the same as or similar to the above descriptions of embodiments including a base film 21.

In a method for manufacturing a semiconductor device according to an embodiment of the inventive concept, an adhesive member includes a gas blowing agent, which is decomposed by light of a specific wavelength to form nitrogen gas and radicals. Therefore, when separating the adhesive member and a carrier substrate from a device wafer, adhesive strength of the adhesive member is decreased and pores are formed between the adhesive member and the device wafer by irradiating the adhesive member with light of a specific wavelength, and thus the separation process may be performed smoothly without causing a crack in the device wafer. Therefore, the yield may be improved.

Although the embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A method of manufacturing a semiconductor device, comprising:
bonding a carrier substrate onto a device wafer with an adhesive member,
wherein the adhesive member comprises:
a base film;
a device adhesive film disposed on a first surface of the base film and contacting the device wafer; and
a carrier adhesive film disposed on a second surface of the base film and contacting the carrier substrate,
wherein the device adhesive film comprises a gas blowing agent, and
wherein the carrier adhesive film does not include any gas blowing agent.

2. The method of claim 1, further comprising:
performing a first curing of each of the device adhesive film and the carrier adhesive film by radiating first ultraviolet light of a first wavelength through the carrier substrate;
thereafter, reducing a thickness of the device wafer by performing a back grinding process on a wafer substrate of the device wafer;
thereafter, performing a second curing of the device adhesive film by radiating second ultraviolet light of a second wavelength that is different from the first wavelength through the carrier substrate, wherein the gas blowing agent forms pores between the device adhesive film and the wafer substrate as a result of the radiating of the second ultraviolet light; and
thereafter, separating the carrier substrate and the adhesive member from the device wafer with the carrier substrate and the adhesive member adhered to each other during and immediately after separating from the device wafer.

3. The method of claim 2,
wherein the device wafer comprises a via partially penetrating the wafer substrate,
wherein the back grinding process exposes the via to form a through substrate via extending through the wafer substrate, and
wherein the method further comprises forming a conductive pad contacting the through substrate via on the device wafer before radiating the second ultraviolet light.

4. The method of claim 2, wherein the second wavelength is greater than the first wavelength.

5. The method of claim 4, wherein the first wavelength is in the range of 300 nm to 349 nm, and the second wavelength is in the range of 350 nm to 400 nm.

6. The method of claim 2,
wherein the gas blowing agent is decomposed by the second ultraviolet light to form radicals and nitrogen gas,
wherein the nitrogen gas concentrates and form the pores, and
wherein the radicals perform the second curing of the device adhesive film by cross-linking to polymer chains of the device adhesive film.

7. The method of claim 6, wherein the gas blowing agent is diazirine, and the radicals are carbene.

8. The method of claim 1, wherein the gas blowing agent is diazirine.

9. The method of claim 1,
wherein the carrier adhesive film comprises a first resin, a first cross-linking agent, a first filler, and a first release agent, and
wherein the device adhesive film further comprises a second resin, a second cross-linking agent, a second filler, and a second release agent.

10. The method of claim 9,
wherein the adhesive member further comprises:
    a first adhesive auxiliary film between the base film and the carrier adhesive film; and
    a second adhesive auxiliary film between the base film and the device adhesive film,
wherein the first adhesive auxiliary film comprises the first resin, the first cross-linking agent, and the first filler, and does not include the first release agent, and
the second adhesive auxiliary film comprises the second resin, the second cross-linking agent, and the second filler, and does not include the second release agent.

11. A method of manufacturing a semiconductor device, comprising:
bonding a carrier substrate onto a device wafer with an adhesive member formed between the carrier substrate and the device wafer;
thereafter, performing a first curing of the adhesive member by radiating first light of a first wavelength through the carrier substrate;
thereafter, reducing a thickness of the device wafer by performing a back grinding process on the device wafer;
thereafter, performing a second curing of the adhesive member by radiating second light of a second wavelength that is different from the first wavelength through the carrier substrate, the radiating of the second light causing the formation of pores between the adhesive member and the device wafer to reduce the adhesive strength between the adhesive member and the device wafer while maintaining the adhesive strength between the adhesive member and the carrier substrate; and
thereafter, separating the carrier substrate and the adhesive member from the device wafer with the carrier substrate and the adhesive member adhered to each other during and immediately after separating from the device wafer.

12. The method of claim 11,
wherein the adhesive member comprises:
    a base film;
    a device adhesive film disposed on a first surface of the base film and contacting the device wafer; and
    a carrier adhesive film disposed on a second surface of the base film and contacting the carrier substrate,
wherein the device adhesive film comprises a gas blowing agent, and
wherein the carrier adhesive film does not include any gas blowing agent.

13. The method of claim 11,
wherein the device wafer comprises a via partially penetrating a wafer substrate of the device wafer,
wherein the back grinding process exposes the via to form a through substrate via extending through the wafer substrate, and
wherein the method further comprises forming a conductive pad contacting the through substrate via on the device wafer before radiating the second light.

14. The method of claim 11, wherein the first wavelength is in the range of 300 nm to 349 nm, and the second wavelength is in the range of 350 nm to about 400 nm.

15. The method of claim 11,
wherein the adhesive member comprises a gas blowing agent,
wherein the gas blowing agent is decomposed by the second light to form radicals and nitrogen gas,
wherein the nitrogen gas concentrates and forms the pores, and
wherein the radicals perform the second curing of the adhesive member by cross-linking to polymer chains of the adhesive member.

16. The method of claim 15, wherein the gas blowing agent is diazirine, and the radicals are carbene.

17. A method of manufacturing a semiconductor device, comprising:
bonding a carrier substrate onto a device wafer using an adhesive member;
thereafter, performing a first curing of the adhesive member by radiating first ultraviolet light of a first wavelength through the carrier substrate;
thereafter, reducing a thickness of the device wafer by performing a back grinding process on the device wafer;
thereafter, performing a second curing of the adhesive member by radiating second ultraviolet light of a second wavelength that is different from the first wavelength through the carrier substrate, the radiating of the second ultraviolet light causing the formation of pores between the adhesive member and the device wafer to reduce the adhesive strength between the adhesive member and the device wafer while maintaining the adhesive strength between the adhesive member and the carrier substrate; and
thereafter, separating the carrier substrate and the adhesive member from the device wafer with the carrier substrate and the adhesive member adhered to each other during and immediately after separating from the device wafer,
wherein the adhesive member comprises:
    a base film;
    a device adhesive film disposed on a first surface of the base film and contacting the device wafer; and
    a carrier adhesive film disposed on a second surface of the base film and contacting the carrier substrate, wherein the device adhesive film comprises a gas blowing agent, and wherein the carrier adhesive film does not include any gas blowing agent.

18. The method of claim 17, wherein the first wavelength is in the range of 300 nm to 349 nm, and the second wavelength is in the range of 350 nm to 400 nm.

19. The method of claim 17, wherein the gas blowing agent is decomposed by the second ultraviolet light to form radicals and nitrogen gas, and wherein the gas blowing agent is diazirine, and the radicals are carbene.

20. The method of claim 17, wherein the pores are formed along a surface of the device wafer that is in contact with the device adhesive film, the formation of the pores thereby reducing an amount of surface area of the device adhesive film that is in contact with the device wafer and reducing the adhesive strength between the device adhesive film and the device wafer.

\* \* \* \* \*